United States Patent
Wang et al.

(10) Patent No.: US 10,664,067 B2
(45) Date of Patent: May 26, 2020

(54) ADJUSTABLE MOUSE

(71) Applicant: CONTOUR DESIGN, INC., Windham, NH (US)

(72) Inventors: Steven Wang, Windham, NH (US); Andrew David Morgan, Derry, NH (US); Scott Ernest Venti, Auburn, NH (US)

(73) Assignee: CONTOUR DESIGN, INC., Windham, NH (US)

( * ) Notice: Subject to any disclaimer, the term of this patent is extended or adjusted under 35 U.S.C. 154(b) by 0 days.

(21) Appl. No.: 15/999,504

(22) Filed: Aug. 20, 2018

(65) Prior Publication Data
US 2019/0056805 A1    Feb. 21, 2019

Related U.S. Application Data

(60) Provisional application No. 62/548,080, filed on Aug. 21, 2017.

(51) Int. Cl.
*G06F 3/0354* (2013.01)
*G06F 3/02* (2006.01)
(Continued)

(52) U.S. Cl.
CPC ........ *G06F 3/03543* (2013.01); *G06F 3/0202* (2013.01); *G06F 3/0362* (2013.01);
(Continued)

(58) Field of Classification Search
CPC ..... G06F 2203/0333; G06F 2203/0332; G06F 3/03543; G06F 3/0362; G06F 3/0202
See application file for complete search history.

(56) References Cited

U.S. PATENT DOCUMENTS 4,913,573 A * 4/1990 Retter .................. B41J 5/10
345/163
5,260,696 A   11/1993 Maynard, Jr.
(Continued)

FOREIGN PATENT DOCUMENTS

CN    2828923 Y    10/2006
CN    203102185 U    7/2013
(Continued)

OTHER PUBLICATIONS

Gasior, G., "Cyborg's RAT 7 adjustable gaming mouse," The Tech Report PC Hardware Explored, Oct. 6, 2010, pp. 1-5.
(Continued)

*Primary Examiner* — Ariel A Balaoing
(74) *Attorney, Agent, or Firm* — Lando & Anastasi, LLP

(57) ABSTRACT

An adjustable mouse includes a base portion including a flat bottom configured to rest on a flat surface and a curved top, a palm rest portion including a body configured to be contoured to fit a user's hand and a curved bottom that is configured to mate with the curved top of the base portion, and a mechanism configured to secure the palm rest portion to the base portion at a desired angle of tilt. The adjustable mouse further includes a thumb adjustment assembly coupled to the base portion. The thumb adjustment assembly is configured to move a thumb rest portion between a retracted position and an extended position.

22 Claims, 11 Drawing Sheets

(51) Int. Cl.
  *G06F 3/0362* (2013.01)
  *H03K 17/965* (2006.01)
(52) U.S. Cl.
  CPC ... *H03K 17/965* (2013.01); *G06F 2203/0332* (2013.01); *G06F 2203/0333* (2013.01)

(56) References Cited

U.S. PATENT DOCUMENTS

| | | | |
|---|---|---|---|
| 5,576,733 A | 11/1996 | Lo | |
| D383,453 S | 9/1997 | Scenna et al. | |
| 5,870,081 A | 2/1999 | Wu | |
| 5,894,302 A | 4/1999 | Scenna et al. | |
| 5,990,870 A * | 11/1999 | Chen | G06F 3/03543 345/156 |
| 6,072,471 A | 6/2000 | Lo | |
| 6,157,370 A | 12/2000 | Kravtin et al. | |
| D447,748 S | 9/2001 | Loughnane et al. | |
| D448,380 S | 9/2001 | Sheehan et al. | |
| 6,304,249 B1 * | 10/2001 | Derocher | G06F 1/1616 248/118.1 |
| 6,396,478 B1 | 5/2002 | Kravtin et al. | |
| D461,188 S | 8/2002 | Lo | |
| 6,489,947 B2 | 12/2002 | Hesley et al. | |
| 6,625,423 B1 | 9/2003 | Wang | |
| D556,711 S | 12/2007 | Lee et al. | |
| D627,355 S | 11/2010 | Blanchard | |
| D632,691 S | 2/2011 | Lo | |
| D681,039 S | 4/2013 | Altaai | |
| 9,092,073 B1 * | 7/2015 | Wang | G06F 3/03543 |
| D768,633 S | 10/2016 | Helwig et al. | |
| 9,569,014 B2 | 2/2017 | Drougge | |
| 9,684,387 B2 | 6/2017 | Wang et al. | |
| D792,882 S | 7/2017 | Helwig et al. | |
| D793,393 S | 8/2017 | Jeong et al. | |
| D813,869 S | 3/2018 | Hu | |
| 2003/0214484 A1 | 11/2003 | Haywood | |
| 2006/0170655 A1 | 8/2006 | Hou et al. | |
| 2008/0170038 A1 * | 7/2008 | Chiang | G06F 1/1628 345/163 |
| 2010/0295787 A1 * | 11/2010 | Tang | G06F 3/03543 345/166 |
| 2014/0128229 A1 * | 5/2014 | York | A63B 21/078 482/104 |
| 2014/0267040 A1 | 9/2014 | Theytaz et al. | |
| 2015/0022451 A1 | 1/2015 | Drougge | |
| 2016/0209941 A1 * | 7/2016 | Hadas | G06F 3/011 |
| 2016/0334865 A1 * | 11/2016 | Siegfried | G06F 3/01 |
| 2017/0192536 A1 * | 7/2017 | Wang | G06F 3/03543 |

FOREIGN PATENT DOCUMENTS

| | | | | |
|---|---|---|---|---|
| EP | 3321783 A1 | | 5/2018 | |
| KR | 20040063774 A | | 7/2004 | |
| WO | 2013103315 A2 | | 7/2013 | |
| WO | 2014122191 A1 | | 8/2014 | |
| WO | 2016/086854 A1 | | 6/2016 | |
| WO | WO2016/086854 | * | 6/2016 | ............. G06F 3/033 |

OTHER PUBLICATIONS

Greenwald, W., "Cyborg R.A.T. 9 Gaming Mouse," PCMag.com, Jun. 14, 2011, pp. 1-6.

* cited by examiner

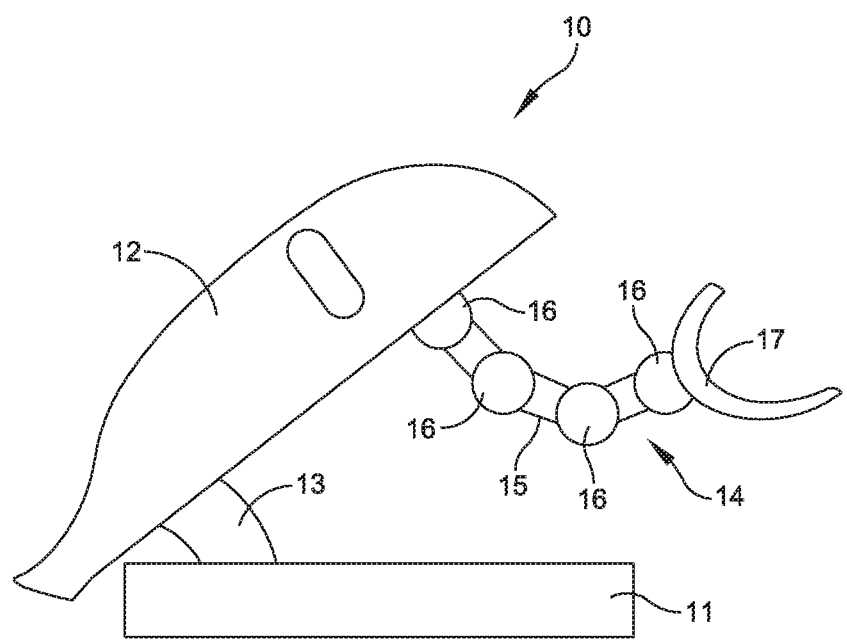
FIG. 11
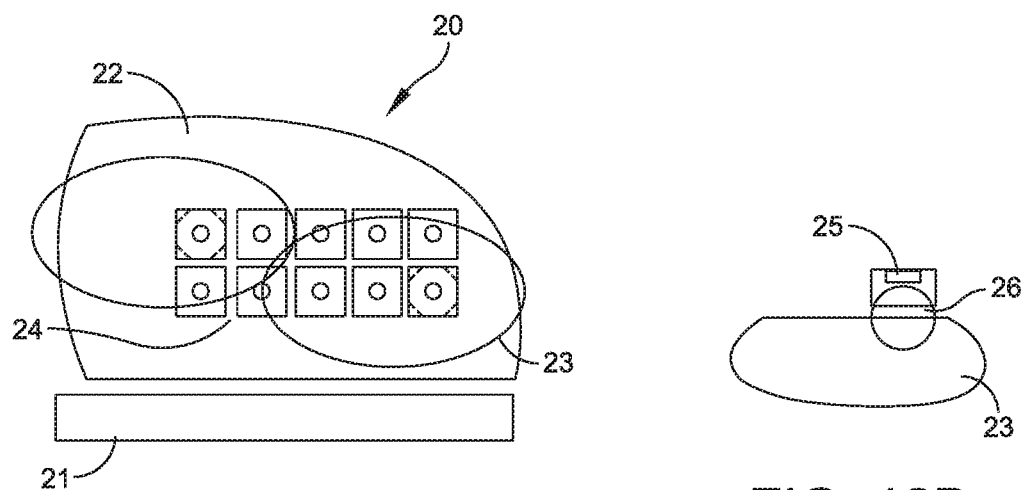
FIG. 12A
FIG. 12B

US 10,664,067 B2

ADJUSTABLE MOUSE

CROSS-REFERENCE TO RELATED APPLICATION

This application claims priority to U.S. Provisional Patent Application No. 62/548,080, filed Aug. 21, 2017, titled ADJUSTABLE MOUSE, which is incorporated by reference in its entirety for all purposes.

BACKGROUND OF THE DISCLOSURE

This disclosure relates generally to pointing devices, and more specifically to an adjustable mouse that detects two-dimensional motion relative to a surface and enables fine control of a graphical user interface ("GUI").

A typical mouse includes two or more buttons and a scroll wheel, which can also act as an additional button to move a pointer in two dimensions on a GUI. A mouse can also include a thumb rest support, which is contoured to comfortably receive a user's thumb. It is desirable that the mouse fits comfortably within the user's hand while manipulating the mouse.

SUMMARY OF THE DISCLOSURE

One aspect of the disclosure is directed to an adjustable mouse comprising a base portion including a flat bottom configured to rest on a flat surface and a curved top, a palm rest portion including a body configured to be contoured to fit a user's hand and a curved bottom that is configured to mate with the curved top of the base portion, and a mechanism configured to secure the palm rest portion to the base portion at a desired angle of tilt.

Embodiments of the adjustable mouse further may include configuring the mechanism to achieve a tilt angle between the palm rest portion and the base portion from a minimum angle shown of 21-degree to a maximum angle of 36-degree. The mechanism may include at least one slot formed in the curved bottom of the palm rest portion, at least one slide anchor, and at least one slide rail, with the at least one slide rail being positioned within the at least one slot. The mechanism further may include a threaded fastener that fastens the at least one slide anchor to the at least one slide rail to clamp the bottom of the palm rest portion between the at least one slide anchor and the at least one slide rail. The mechanism further may include two slots, and two respective slide anchors and slide rails. The body of the palm rest portion may include at least one finger button and/or a scroll wheel, which the user manipulates to operate the adjustable mouse. The adjustable mouse further may include a thumb adjustment assembly coupled to the base portion. The thumb adjustment assembly may be configured to move a thumb rest portion between a retracted position and an extended position. The thumb adjustment assembly may include a shaft that extends from a body of the thumb rest portion, with the shaft being coupled by the base portion to move the thumb rest portion toward and away from the palm rest portion and up and down with respect to the base portion. The shaft may be frictionally received within a hub to extend and retract the thumb rest portion in a telescopic fashion. The shaft may be coupled to the base portion by a pivot post that extends from the base portion and a bracket configured to rotate about the pivot post, with the shaft being configured to pivot with respect to the base portion. The pivot post may extend from the curved top of the base portion. The pivot post may include a cylindrical shaft and a cylindrical hub configured to frictionally receive the cylindrical shaft therein, with the cylindrical shaft being secured at one end to the bracket with the other end being frictionally received within the cylindrical hub, and with the cylindrical hub being mounted on the curved top of the base portion. The cylindrical shaft may be secured to the bracket to enable the cylindrical hub and the cylindrical shaft to rotate with respect to the pivot post. The shaft may be secured to the thumb rest portion by a ball joint.

Another aspect of the disclosure is directed to an adjustable mouse comprising a base portion, a palm rest portion coupled to the base portion, the palm rest portion being configured to be secured to the base portion at a desired angle of tilt, and a thumb adjustment assembly coupled to the base portion. The thumb adjustment assembly is configured to move a thumb rest portion between a retracted position and an extended position.

Embodiments of the adjustable mouse further may include the thumb adjustment assembly having a shaft that extends from a body of the thumb rest portion, with the shaft being coupled by the palm rest portion to move the thumb rest portion toward and away from the palm rest portion and up and down with respect to the base portion. The shaft may be coupled to the base portion by a pivot post that extends from the base portion and a bracket configured to rotate about the pivot post, the shaft being configured to pivot with respect to the base portion. The pivot post may extend from the curved top of the base portion. The pivot post may include a cylindrical shaft and a cylindrical hub configured to frictionally receive the cylindrical shaft therein, with the cylindrical shaft being secured at one end to the bracket with the other end being frictionally received within the cylindrical hub, the cylindrical hub being mounted on the curved top of the base portion. The cylindrical shaft is secured to the bracket to enable the cylindrical hub and the cylindrical shaft to rotate with respect to the pivot post. The adjustable mouse further may include a mechanism configured to secure the palm rest portion to the base portion at a desired angle of tilt. The mechanism may be configured to achieve a tilt angle between the palm rest portion and the base portion from a minimum angle shown of 21-degree to a maximum angle of 36-degree. The mechanism may include at least one slot formed in the curved bottom of the palm rest portion, at least one slide anchor, and at least one slide rail, with the at least one slide rail being positioned within the at least one slot. The mechanism further may include a threaded fastener that fastens the at least one slide anchor to the at least one slide rail to clamp the bottom of the palm rest portion between the at least one slide anchor and the at least one slide rail. The mechanism may include two slots, and two respective slide anchors and slide rails.

Another aspect of the disclosure is directed to an adjustable mouse comprising a base, and a thumb rest support assembly coupled to the base. The thumb rest support assembly includes an adjustable arm having two or more ball joints to provide flexibility to a thumb rest support to achieve a wide range of positions.

Another aspect of the disclosure is directed to an adjustable mouse comprising a base, and a thumb rest support coupled to the base, the thumb rest support is configured to be removed and repositioned to a different point on a magnetic grid using a magnetic attachment associated with the thumb rest support. In one embodiment, additional adjustments can be made to the thumb rest support position by use of a ball joint attached to the thumb rest support.

Another aspect of the disclosure is directed to an adjustable mouse comprising a base, and a thumb rest support assembly coupled to the base. The thumb rest support assembly includes a screw that is mounted on an underside of the base, a gear that is threadably secured to the screw, and a thumb rest support that is coupled to the gear by a shaft. The thumb rest support of the thumb rest support assembly travels along a length of the screw to precisely position the thumb rest support.

Another aspect of the disclosure is directed to an adjustable mouse comprising a base, and a thumb rest support assembly coupled to the base. The thumb rest support assembly includes a thumb rest support that is mounted to the base by two arms configured to enable a swinging adjustment into a close or extended position.

Another aspect of the disclosure is directed to an adjustable mouse comprising a base, and a thumb rest support assembly coupled to the base. The thumb rest support assembly is attached to a rail, which is built into the base, the rail enabling horizontal adjustment of a thumb rest support by moving the thumb rest support assembly with respect to the base. In another embodiment, the thumb rest support assembly may include a thumb rest support that contains a molded rail section which enables slight shifting of thumb position.

Another aspect of the disclosure is directed to an adjustable mouse comprising a base, and a thumb rest support assembly rotatably coupled to the base. The thumb rest support assembly includes a telescopic shaft pivotally connected to the base and a thumb rest support pivotally connected to the telescopic shaft. The telescopic shaft and the thumb rest support enable the thumb rest support assembly to tilt up and down from a fixed axis and to extend outwardly or inwardly along an axis of the telescopic shaft.

Another aspect of the disclosure is directed to an adjustable mouse comprising a base, and a thumb rest support assembly coupled to the base. The thumb rest support assembly includes a detachable arm that can be is replaced with one of several detachable arms that are molded at specific angles. Each detachable arm may include a thumb rest support pivotally coupled to the arm.

Another aspect of the disclosure is directed to an adjustable mouse comprising a base, and a thumb rest support assembly having a thumb rest support that is mounted to a rail of the base for fine horizontal adjustment of the thumb rest support. The rail also may have an attached ball joint that is mounted to a telescoping arm to adjust an angle and an extension of the thumb rest support.

Another aspect of the disclosure is directed to an adjustable mouse comprising a base, and a thumb rest support assembly coupled to the base. The thumb rest support assembly includes an arm that is comprised of two or more linked axles to adjust a thumb rest support position and extension.

Embodiments of the adjustable mouse further may include configuring the base to have a base portion and palm rest portion that is hingedly secured to the base portion by a hinge.

BRIEF DESCRIPTION OF THE DRAWINGS

The foregoing will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 11 is a schematic view of a thumb adjustment assembly of an adjustable mouse of an embodiment of the present disclosure;

FIGS. 12A and 12B are schematic views of a thumb adjustment assembly of an adjustable mouse of another embodiment of the present disclosure;

DETAILED DESCRIPTION OF THE DISCLOSURE

Aspects of the present disclosure are directed to a mouse that is configured to adjust a palm rest portion, a thumb rest portion, and locations of buttons and a scroll wheel of the mouse to better accommodate a user's hand. Thus, the mouse of embodiments of the present disclosure is capable of being adjusted to suit a size of a particular user's hand. In one embodiment, the mouse is capable of adjusting an angle of a body defining the palm rest portion of the mouse with respect to a base portion of the mouse. Specifically, the mouse is adjustable so that the palm rest portion of the mouse achieves a desired angle with respect to the base portion. The palm rest portion and associated input controls slide along an arc thereby making the mouse more ergonomically efficient for the user.

For example, the adjustable mouse enables varying angle adjustments that a user can adjust to relieve stress on nerves and muscles that become too used or active when using a fixed angled mouse that was not correctly designed for their hand. The adjustable mouse is configured to relieve stress in a position initially found comfortable with the mouse, but is found to be uncomfortable after prolonged use made stress in other areas of the hand with previous adjustments.

Another aspect of the disclosure is directed to a mouse having a thumb adjustment assembly, which provides several axis of freedom of a user's thumb. In one embodiment, the thumb adjustment assembly includes a thumb rest portion and a shaft that extends from the thumb rest portion. The thumb adjustment assembly includes an extendable shaft secured to the thumb rest portion by a universal ball joint, with the extendable shaft being pivotally secured to an extendable pivot post that secured to the base portion.

Figure 1:
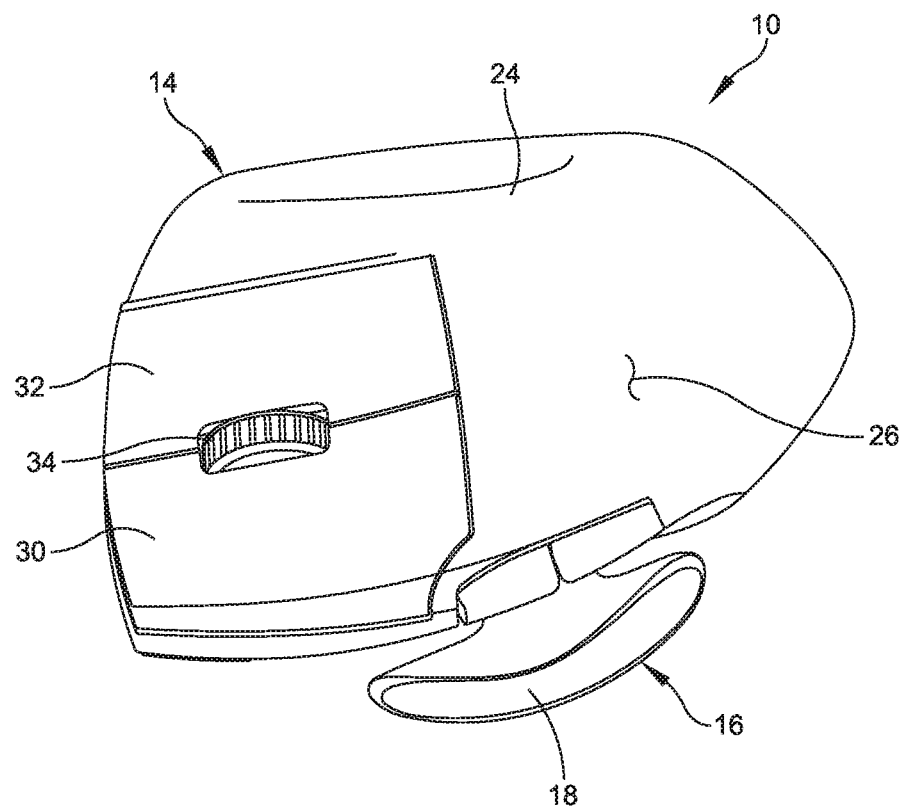
FIG. 1 is a top view of an adjustable mouse of an embodiment of the present disclosure.
Figure 2:
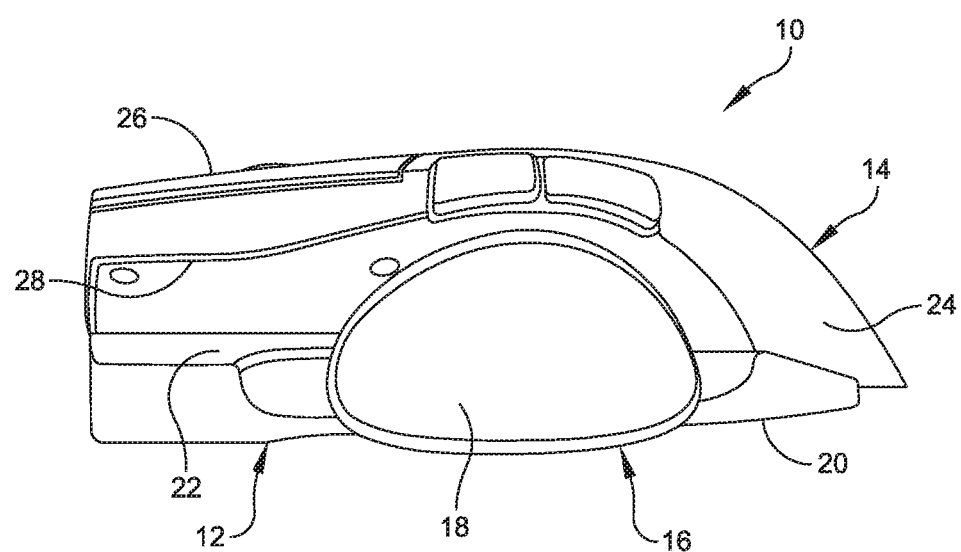
FIG. 2 is a side view of the adjustable mouse.
Figure 3:
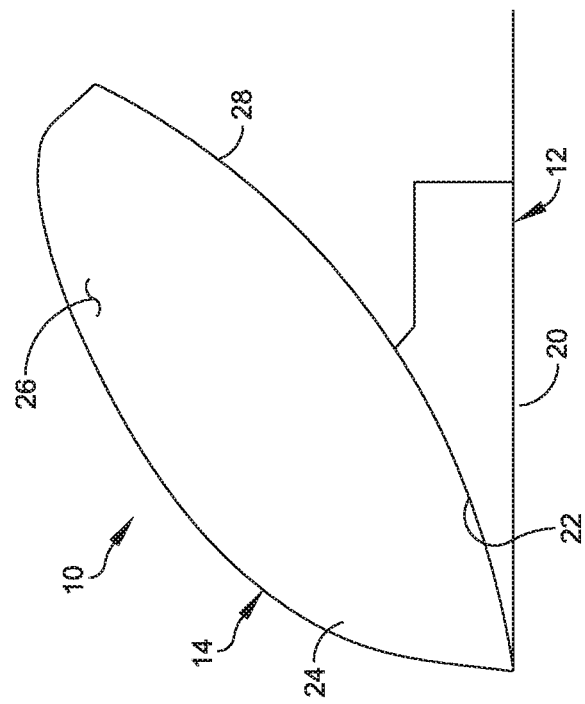
FIG. 3 is a front view of the adjustable mouse.

Referring now to the drawings, and more particularly to FIGS. 1-3, an embodiment of an adjustable mouse is generally indicated at 10. As shown, the mouse 10 is configured for a user's right hand. It should be understood that the mouse 10 may be configured for a user's left hand and still fall within the scope of the present disclosure. As mentioned above, the mouse 10 is configured to control the motion of a pointer in two dimensions in a GUI, with the mouse converting the movements of the user's hand into equivalent electronic signals to move the pointer in the traditional manner. As will be discussed in greater detail below, buttons are provided on the mouse, which may be "clicked" to perform certain actions by the user.

In one embodiment, the mouse 10 includes a base portion, generally indicated at 12, a palm rest portion, generally indicated at 14, that is form fitting to the user's hand, and a thumb adjustment assembly, generally indicated at 16, that is configured to move a thumb rest portion 18. The base portion 12 includes a flat bottom 20 that is configured to rest on a flat surface, e.g., a desk top surface, and a curved top 22 that is configured to interconnect with the palm rest portion 14. As will be described in greater detail below, the palm rest portion 14 is configured to be secured to the base portion 12 to achieve a desired angle of tilt between the palm rest portion and the base portion. Specifically, the palm rest portion 14 is configured to slide with respect to the base portion 12, with the curved top 22 providing the angle of tilt. Also, the manner in which the palm rest portion 14 is secured to the base portion 12 will be discussed as well.

As shown, the palm rest portion 14 includes a shell that defines a body 24 that is contoured to fit the user's hand. As discussed above, although the palm rest portion 14 is designed for a user's right hand, the palm rest portion can be configured to accommodate a user's left hand. The body 24 of the palm rest portion includes a top 26 contoured to fit the user's hand, a curved bottom 28 configured to mate with the curved top 22 of the base portion 12, two finger buttons 30, 32 and a scroll wheel 34, which the user manipulates to operate the adjustable mouse 10 in a traditional manner. The finger buttons 30, 32 are designed to be manipulated by the user's fore and index fingers, respectively, with the scroll wheel 34 being provided between the finger buttons and manipulated by the fore and index fingers. It should be understood that although two finger buttons are provided for adjustable mouse 10, a mouse having less or more finger buttons, or without a scroll wheel, may be provided. As shown, the top 26 of the body 24 of the palm rest portion 14 positions the finger buttons 30, 32 along an arc to conform to the user's hand.

Figure 4A:
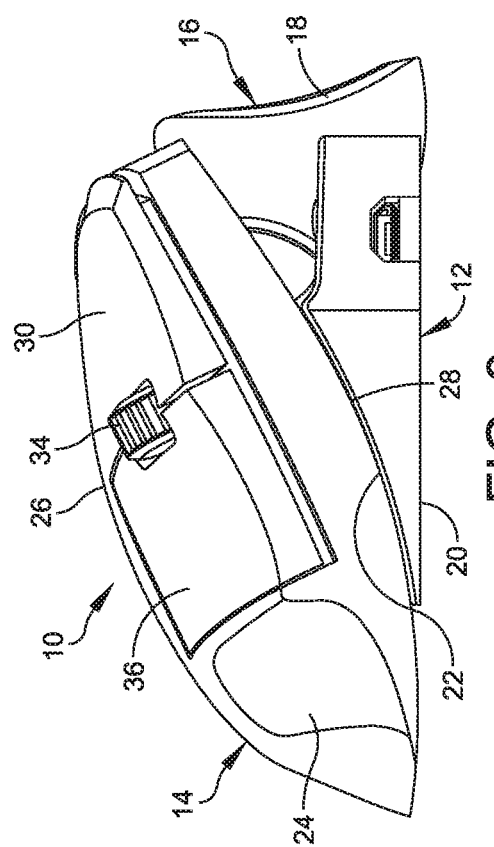
FIG. 4A is a schematic front view of the adjustable mouse with a thumb adjustment assembly removed, showing a palm rest portion disposed at a minimum angle with respect to a base portion.
Figure 4B:
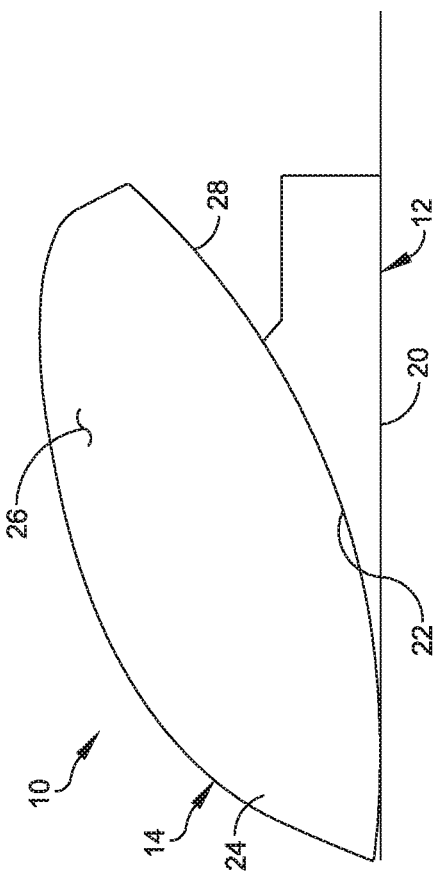
FIG. 4B is a schematic front view of the adjustable mouse with a thumb adjustment assembly removed, showing the palm rest portion disposed at a maximum angle with respect to the base portion.

Referring to FIGS. 4A and 4B, the palm rest portion 14 is configured to be secured to the base portion 12 to achieve a desired angle of tilt between the palm rest portion and the base portion. Specifically, the palm rest portion 14 is configured to achieve a tilt angle from a minimum angle shown in FIG. 4A (21-degree) to a maximum angle shown in FIG. 4B (36-degree) by sliding the palm rest portion with respect to the base portion 12 at the intersection of the mating top 22 of the base portion and the bottom 28 of the body 24 of the palm rest portion.

Figure 6:
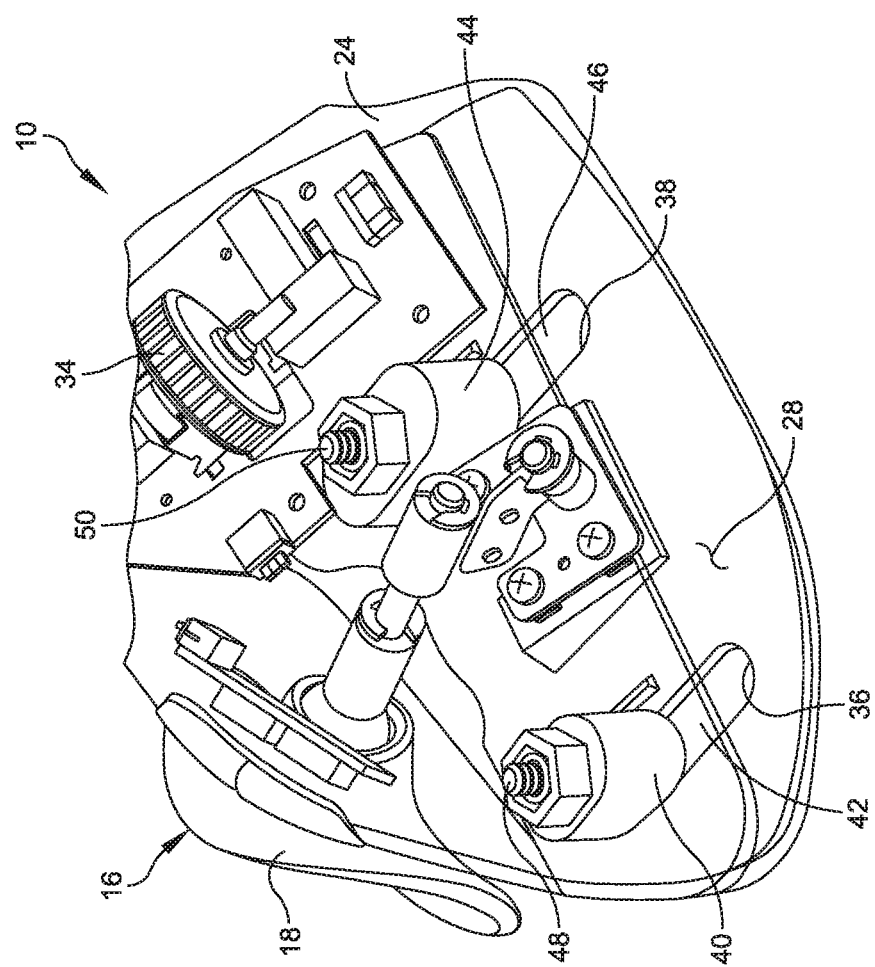
FIG. 6 is a top perspective view of the adjustable mouse with a top of the palm rest portion removed to reveal internal components of the adjustable mouse.
Figure 5:
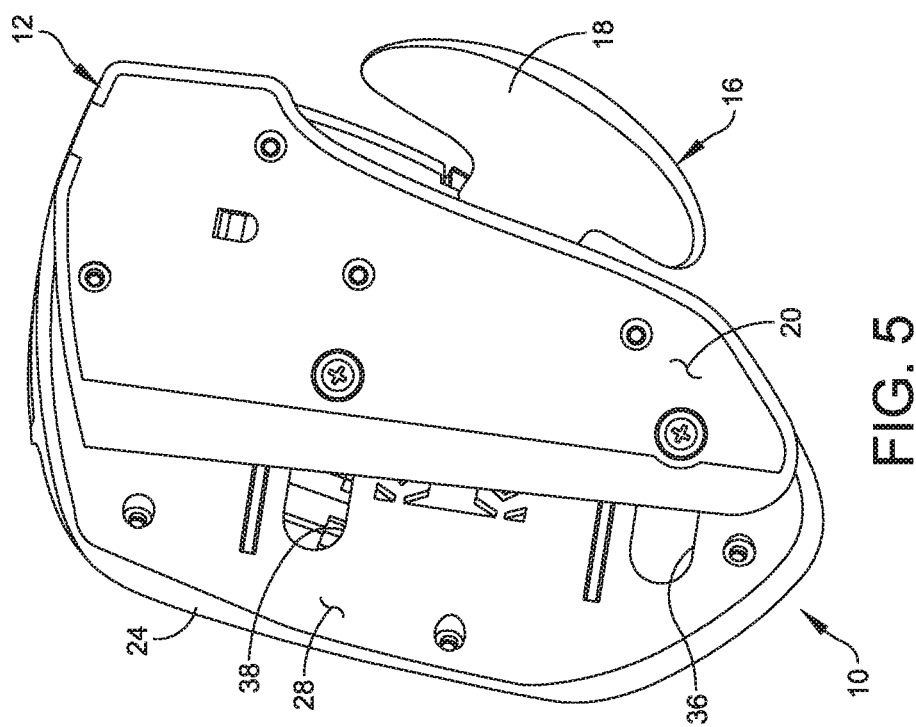
FIG. 5 is a bottom view of the adjustable mouse.
Figure 7:
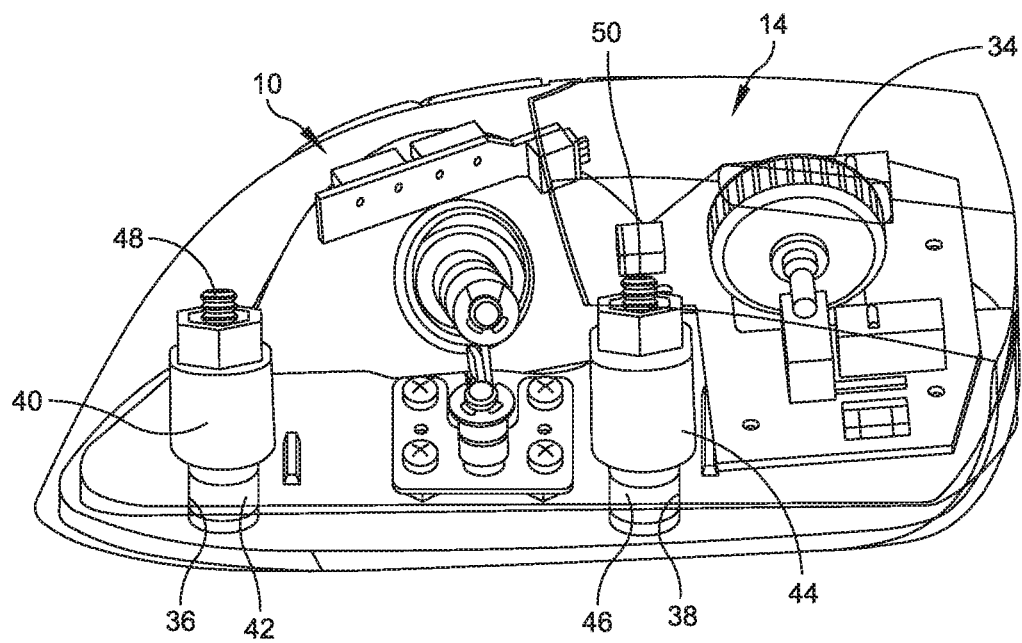
FIGS. 7 and 8 are cross-sectional views of the adjustable mouse.
Figure 8:
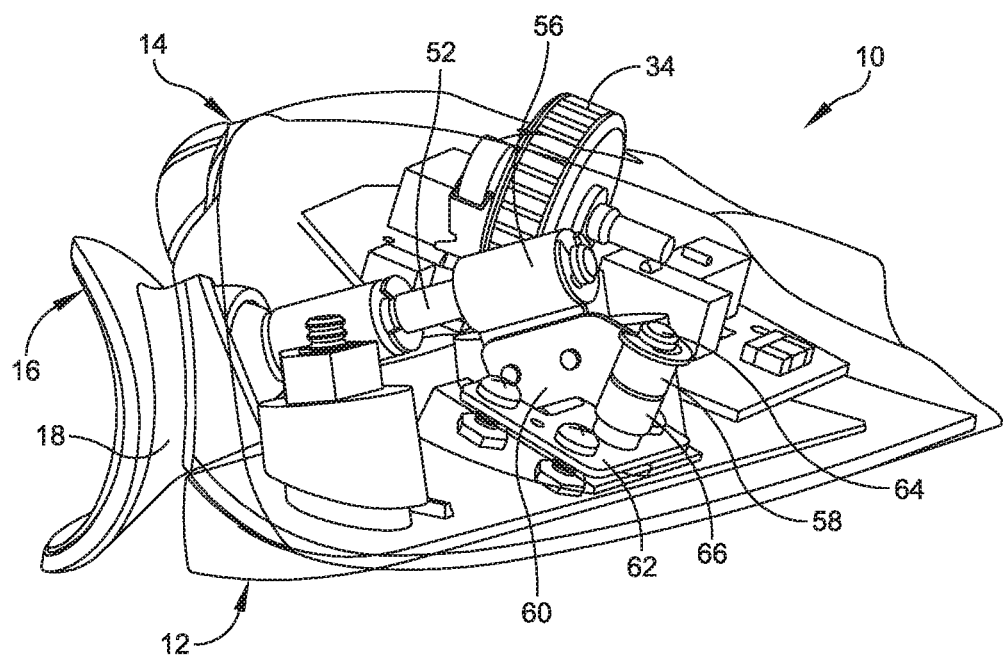

The manner in which the palm rest portion 14 moves with respect to the base portion 12 and is secured to the base portion is shown in FIGS. 5 and 6. As shown, the curved bottom 28 of the palm rest portion 14 is configured to mate with the curved top 22 of the base portion 12. In one embodiment, the curved bottom 28 of the palm rest portion 14 has a first slotted opening 36 and a second slotted opening 38 formed therein. The base portion 12 includes a first slide anchor 40 and a first slide rail 42, with the first slide rail being positioned within the first slotted opening 36. The base portion 12 further includes a second slide anchor 44 and a slide rail 46, with the second slide rail being positioned within the second slotted opening 38. The arrangement is such that the first slide anchor 40 is secured to the bottom 28 of the palm rest portion 14 by a first threaded fastener 48 used to fasten down the first slide anchor toward the first slide rail 42, thereby clamping the bottom of the palm rest portion between the first slide anchor and the first slide rail. Similarly, the second slide anchor 44 is secured to the bottom 28 of the palm rest portion 14 by a second threaded fastener 50 used to fasten down the second slide anchor toward the second slide rail 46. In certain embodiments, the first and second threaded fasteners 48, 50 can embody machine screws.

As shown, access to the heads of the first and second threaded fasteners 48, 50 can be found on the bottom 20 of the base portion 12. The first and second threaded fasteners 48, 50 operate in the traditional manner. Turning the first and second threaded fasteners 48, 50 in a counterclockwise direction loosens the threaded fasteners and thereby releases the bottom 28 of the palm rest portion 14 from the first and second slide anchors 40, 44 and the first and second slide rails 42, 46. Turning the first and second threaded fasteners 48, 50 in a clockwise direction tightens the threaded fasteners and thereby secures the bottom 28 of the palm rest portion 14 between the first and second slide anchors 40, 44 and the first and second slide rails 42, 46. The user can select a desired angle by moving or sliding the palm rest portion 14 with respect to the base portion 12, and securing the palm rest portion to the base portion by tightening the first and second threaded fasteners 48, 50 to maintain the palm rest portion in the desired position.

In one embodiment, the user can vary an angle or tilt of the palm rest portion 14 with respect to the base portion 12 of the adjustable mouse 10 between 21-degree to 36-degree. However, the construction of the curvature of the curved top 22 of the base portion 12, the curvature of the curved bottom 28 of the palm rest portion 14, the first and second slotted openings 36, 38 formed in the curved bottom of the palm rest portion, the first and second slide anchors 40, 44 and the first and second slide rails 42, 46 may be configured to achieve any desired angle of tilt, e.g., a 10-degree to a 50-degree angle of tilt with respect to a horizontal plane.

In certain embodiments of the adjustable mouse disclosed herein, the tilting angle of the palm rest portion with respect to the base portion is used to reposition the palm rest portion of the adjustable mouse towards either a more horizontal oriented placement (e.g., at a 21-degree tilt angle) or a more vertical oriented placement (e.g., a 36-degree tilt angle).

Referring to FIGS. 7-10, the construction of the thumb adjustment assembly 16 is shown and described below. As shown, the thumb adjustment assembly 16 includes the thumb rest portion 18 that is secured to a cylindrical shaft 52 by a universal ball joint 54. The cylindrical shaft 52 is frictionally received within a cylindrical hub 56 to extend and retract the thumb rest portion 18 in a telescopic fashion. In this embodiment, the cylindrical shaft 52 and the cylindrical hub 56 form a telescopic shaft having one segment.

In the shown embodiment, the cylindrical hub 56 is pivotally connected to the top 22 of the base portion 12 by a pivot post 58 and a bracket 60 configured to rotate about the pivot post. As shown, the pivot post 58 is secured to a top surface of the top 22 of the base portion 14 by a bracket 62 mounted on the top of the base portion by several (e.g., four) threaded fasteners. The result is that the pivot post 58 extends perpendicularly from the top 22 of the base portion. Specifically, the cylindrical hub 56 is secured to the bracket 60 (as by welding) to enable the cylindrical hub and the cylindrical shaft 52 to rotate with respect to the pivot post 58. The arrangement is such that the thumb rest portion 18 is configured to move from a position in which the cylindrical shaft 52 extends from the pivot post 58 in a direction generally normal or perpendicular to the direction of the palm rest portion 14 to a forward press position in which the cylindrical shaft extends from the pivot post in a forward pivoted direction. In certain embodiments, the cylindrical shaft 52 can be manipulated to change an angle of the thumb rest portion 18 with respect to the base portion 12 to accommodate the user's hand.

Figure 9:
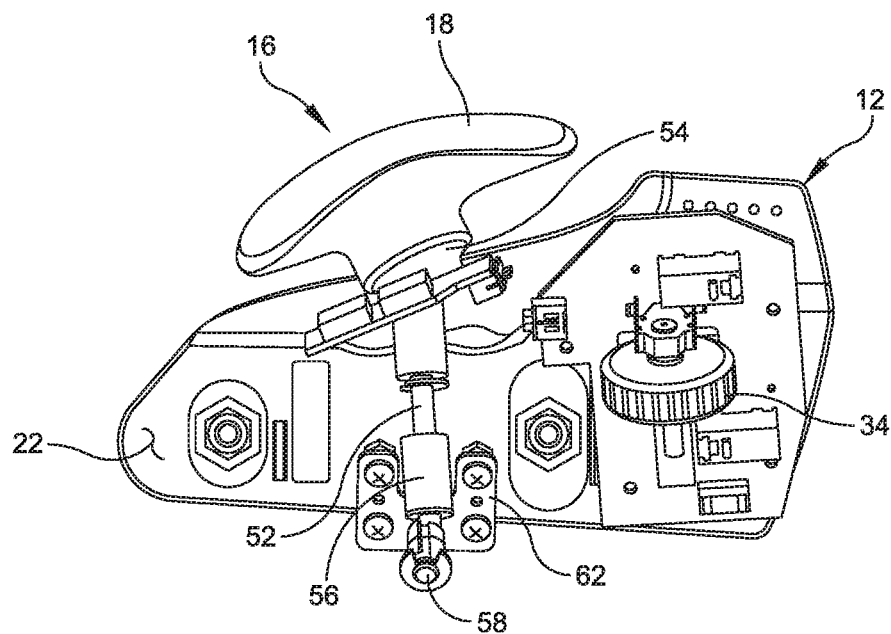
FIG. 9 is a top view with packaging removed of the adjustable mouse.
Figure 10:
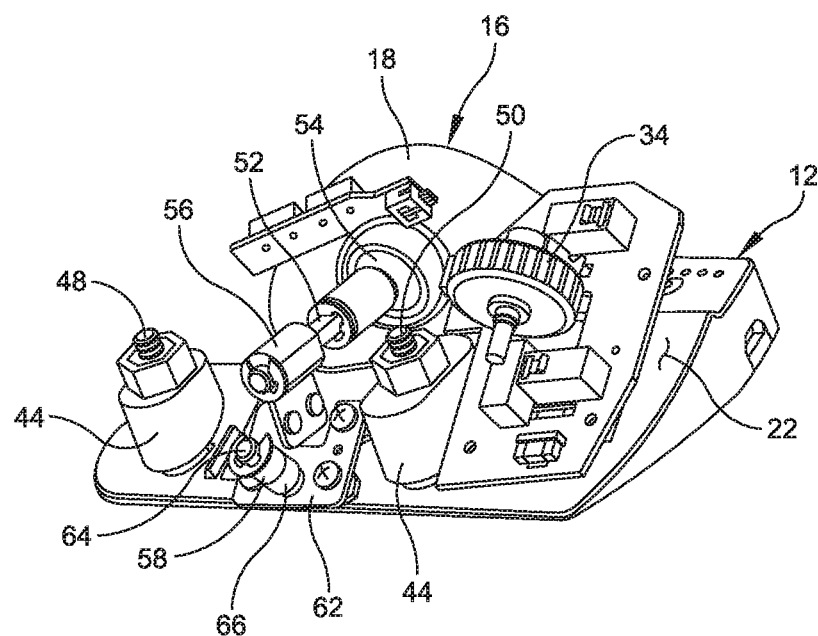
FIG. 10 is a perspective view with packaging removed of the adjustable mouse.

In one embodiment, which is clearly shown in FIGS. 9 and 10, the pivot post 58 can be configured to include a cylindrical shaft 64 that is secured at one end to the bracket 60 and a cylindrical hub 66 that frictionally receives an opposite end of the cylindrical shaft therein. The cylindrical shaft 64 of the pivot post 58 is secured to the bracket 60 to enable the cylindrical hub 56 and the cylindrical shaft 52 to rotate with respect an axis defined by the pivot post. As shown, the cylindrical hub 66 is secured to the bracket 62 that is mounted on the top 22 of the base portion 12. The arrangement is such that the cylindrical shaft 64 is configured to extend and retract to move the cylindrical hub 56 in a direction that is perpendicular to the top 22 of the base portion 12. This motion adjusts an elevational position of the thumb rest portion 18 with respect to the palm rest portion 14. In this embodiment, the cylindrical shaft 64 and the cylindrical hub 66 form a telescopic shaft having one segment.

FIG. 11 illustrates an adjustable mouse, generally indicated at 10. As shown, the adjustable mouse 10 includes a base 11, a body 12 hingedly mounted to the base by a hinge 13, and a thumb rest support assembly, generally indicated at 14, coupled to the body. The body 12 is capable of moving with respect to the base 11 to adjust the body to a desired position comfortable to the user. The thumb rest support assembly 14 includes an adjustable arm 15 having two or more ball joints, each indicated at 16, to provide flexibility to a thumb rest support 17 to achieve a wide range of positions. As shown, four ball joints 16 are provided to position the thumb rest support 17 to a desired position comfortable to the user. However, any number ball joints can be included. In one embodiment, the ball joints 16 are frictionally able to maintain a desired position.

FIGS. 12A and 12B illustrate an adjustable mouse, generally indicated at 20. As shown, the adjustable mouse 20 includes a base 21, a body 22 hingedly mounted to the base, and a thumb rest support 23 coupled to the body. The body 22 is capable of moving with respect to the base 21 to adjust the body to a desired position comfortable to the user. Although not shown, the body 22 may be hingedly mounted to the base in a manner similar to other embodiments of the adjustable mouse. The thumb rest support 23 is configured to be removed and repositioned to a different point on a magnetic grid 24 using a magnetic attachment 25 associated with the thumb rest support. In one embodiment, the magnetic grid 24 is formed by ten pads of ferromagnetic material and the magnetic attachment 25 includes a magnet. However, any number of magnetic pads made of any type of magnetic material can be used. In another embodiment, the magnetic grid 24 can be formed by pads of magnets and the magnetic attachment 25 can include ferromagnetic material. Additional adjustments can be made to the thumb rest support 23 position by use of a ball joint 26 attached to the thumb rest support.

Figure 13:
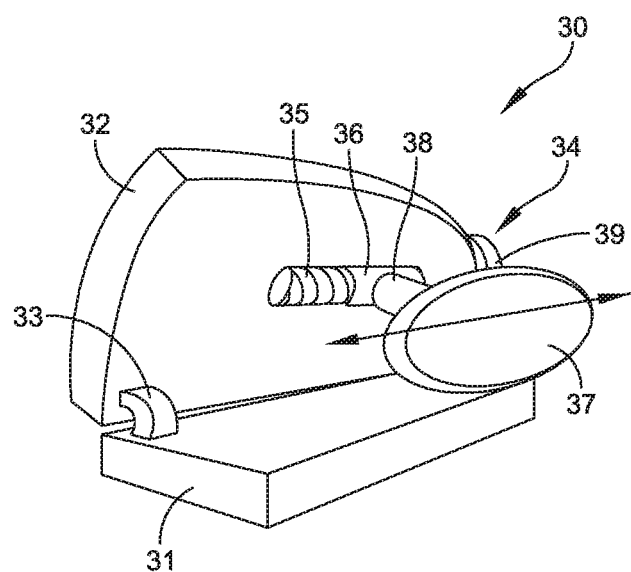
FIG. 13 is a schematic view of a thumb adjustment assembly of an adjustable mouse of another embodiment of the present disclosure.

FIG. 13 illustrates an adjustable mouse, generally indicated at 30. As shown, the adjustable mouse 30 includes a base 31, a body 32 hingedly mounted to the base by a hinge 33, and a thumb rest support assembly 34 coupled to the body. The body 32 is capable of moving with respect to the base 31 to adjust the body to a desired position comfortable to the user. The thumb rest support assembly 34 includes a screw or worm gear 35 that is mounted on an underside of the body 32. The thumb rest support assembly 34 further includes a gear 36 that is threadably secured to the screw 35 and a thumb rest support 37 that is coupled to the gear by a shaft 38, which may be telescopic to extend or retract the thumb rest support. By rotating (or twisting) the gear 36 of the thumb rest support assembly 34, the thumb rest support 37 of the thumb rest support assembly travels down the screw 35, e.g., a corkscrew axis, to precisely position the thumb rest support. A knob 39 may be provided to rotate the screw 35 to move the gear 36 to a desired position comfortable to the user.

Figure 14:
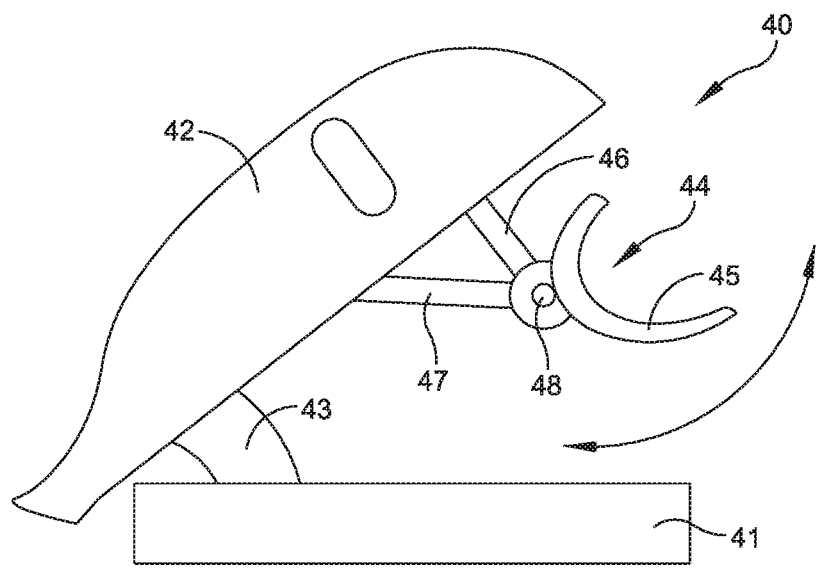
FIG. 14 is a schematic view of a thumb adjustment assembly of an adjustable mouse of another embodiment of the present disclosure.

FIG. 14 illustrates an adjustable mouse, generally indicated at 40. As shown, the adjustable mouse 40 includes a base 41, a body 42 hingedly mounted to the base by a hinge 43, and a thumb rest support assembly, generally indicated at 44, coupled to the body. The body 42 is capable of moving with respect to the base 41 to adjust the body to a desired position comfortable to the user. The thumb rest support assembly 44 includes a thumb rest support 45 that is mounted to the body 42 of the adjustable mouse 40 by two arms 46, 47 connected to the thumb rest support by a pivot 48. The two arms 46, 47 enable a swinging adjustment into a close or extended position by moving the arms from a spaced apart position in which the arms form a generally obtuse angle to a close position in which the arms form a generally acute angle, respectively. Friction may maintain the arms 46, 47 in a desired position comfortable to the user. It is appreciated that although two arms are shown, any number of arms can be used.

Figure 15:
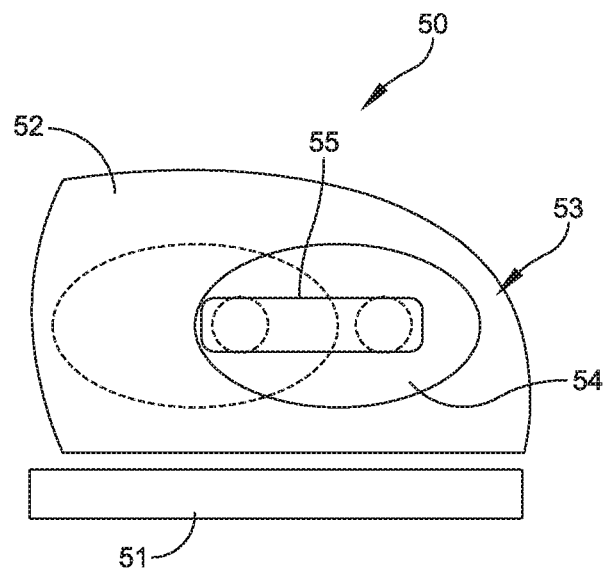
FIG. 15 is a schematic view of a thumb adjustment assembly of an adjustable mouse of another embodiment of the present disclosure.

FIG. 15 illustrates an adjustable mouse, generally indicated at 50. As shown, the adjustable mouse 50 includes a base 51, a body 52 hingedly mounted to the base, and a thumb rest support assembly, generally indicated at 53, coupled to the body. The body 52 is capable of moving with respect to the base 51 to adjust the body to a desired position comfortable to the user. Although not shown, the body 52 may be hingedly mounted to the base in a manner similar to other embodiments of the adjustable mouse. A thumb rest support 54 of the thumb rest support assembly 53 is schematically shown in FIG. 15. The thumb rest support 54 is attached to a rail 55, which is built into the body 52 of the adjustable mouse 50. In one embodiment, the rail 55 extends generally horizontally with respect to the body 52 and the thumb rest support 54 is configured to ride along the rail. The rail 55 enables customizable horizontal adjustment of the thumb rest support 54 by moving the thumb rest support with respect to the body 52. As shown, the rail 55 is built into the body 52 of the adjustable mouse 50. The rail 55 is designed to shift the thumb support assembly forward and backward and to maintain a position along the rail.

Figure 16:
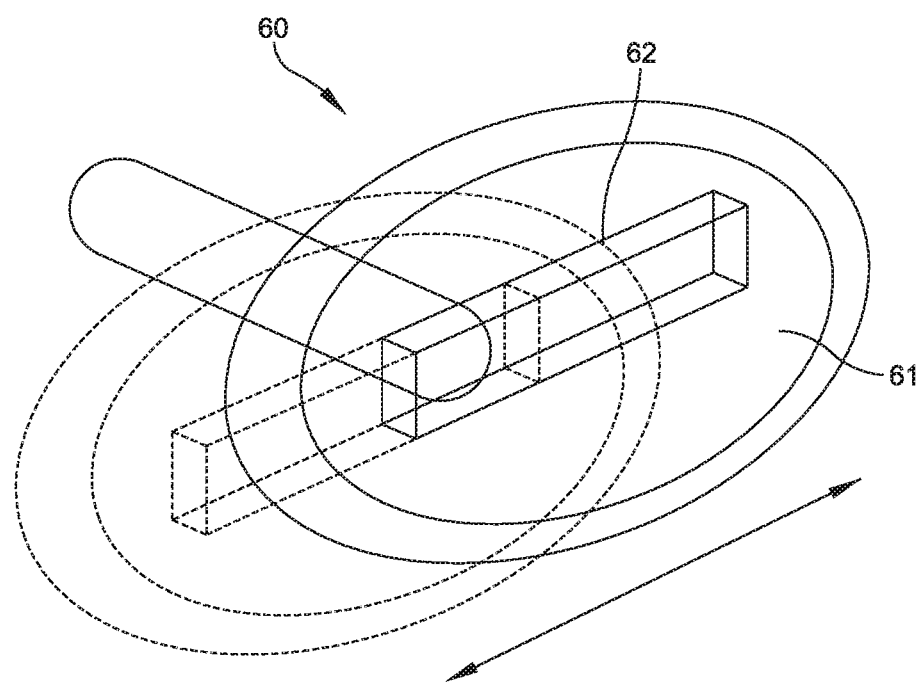
FIG. 16 is a schematic view of a thumb adjustment assembly of an adjustable mouse of another embodiment of the present disclosure.

FIG. 16 illustrates a variation of the adjustable mouse 50 shown in FIG. 15. As shown, a thumb rest support assembly, generally indicated at 60, includes a thumb rest support 61 that contains a molded rail section 62 which enables slight shifting of thumb position. As shown, the rail section 62 is built into the thumb rest support 61 instead of the body. Otherwise, the thumb rest support is configured to operate similarly to the embodiment of FIG. 15. The rail section 62 extends horizontally with respect to the body of the mouse and the thumb rest support 61 is configured to move along the rail. The rail section 62 enables customizable horizontal adjustment of the thumb rest support 62 by moving the thumb rest support along the rail section with respect to the body of the mouse and to maintain a position with respect to the body.

Figure 17:
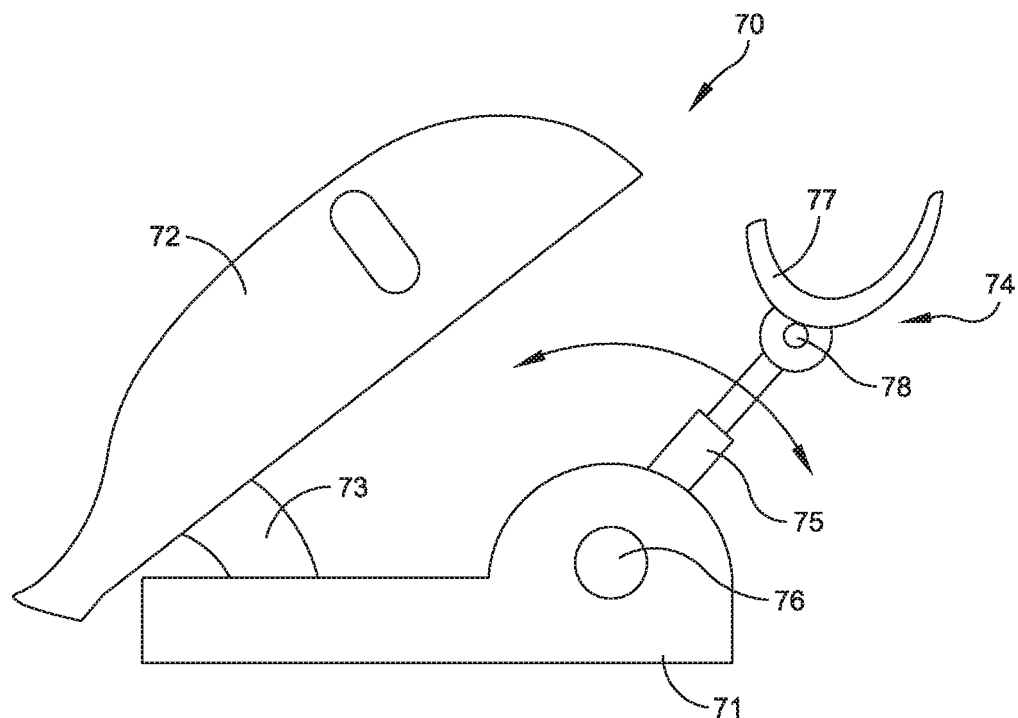
FIG. 17 is a schematic view of a thumb adjustment assembly of an adjustable mouse of another embodiment of the present disclosure.

FIG. 17 illustrates an adjustable mouse, generally indicated at 70. As shown, the adjustable mouse 70 includes a base 71, a body 72 hingedly mounted to the base by a hinge 73, and a thumb rest support assembly, generally indicated at 74, rotatably coupled to the body. The body 72 is capable of moving with respect to the base 71 to adjust the body to a desired position comfortable to the user. The thumb rest support assembly 74 includes a telescopic shaft 75 pivotally connected to the base 71 by a pivot 76, and a thumb rest support 77 pivotally connected to the telescopic shaft by another pivot 78. The pivotal attachment of the telescopic shaft 75 with the base 71 and the thumb rest support 77 enables enable the thumb rest support assembly 74 to tilt up and down from a fixed axis along an arc. The telescopic shaft 75 further enables the thumb rest support 77 to be extended outwardly and retracted inwardly with respect to the base 71 along an axis of the telescopic shaft. A friction pivot and telescoping shaft may maintain the telescopic shaft 75 and the pivots 76, 78 in desired positions comfortable to the user. It is also appreciated that other mechanisms for maintaining the pivotal position can be used.

Figure 18:
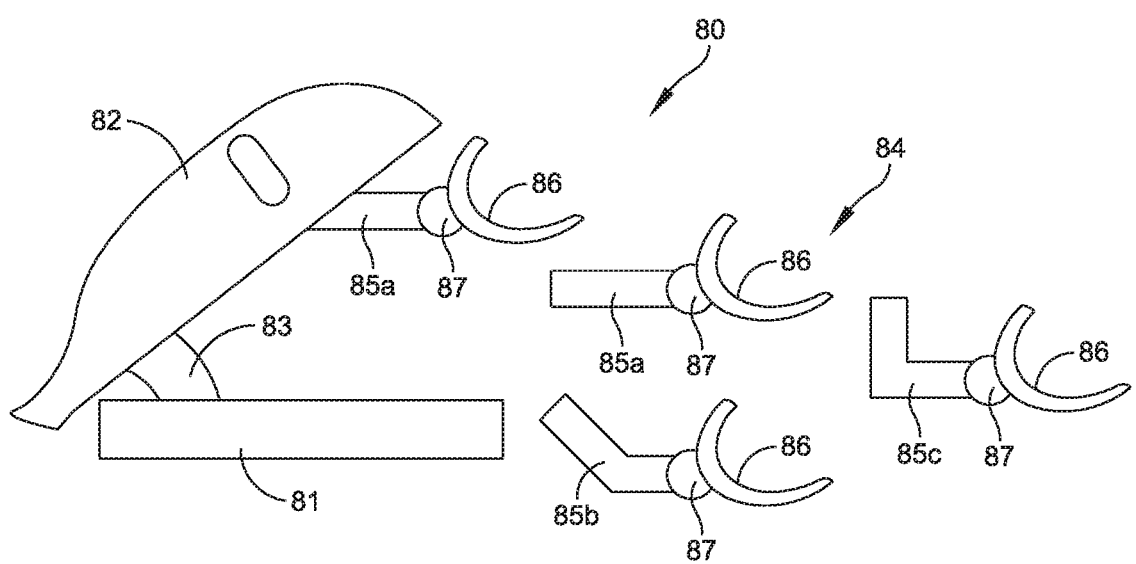
FIG. 18 is a schematic view of a thumb adjustment assembly of an adjustable mouse of another embodiment of the present disclosure.

FIG. 18 illustrates an adjustable mouse, generally indicated at 80. As shown, the adjustable mouse 80 includes a base 81, a body 82 hingedly mounted to the base by a hinge 83, and a thumb rest support assembly, generally indicated at 84, coupled to the body. The body 82 is capable of moving with respect to the base 81 to adjust the body to a desired position comfortable to the user as has been described herein with respect to the other embodiments. The thumb rest support assembly 84 includes several detachable arms, identified by 85*a*, 85*b* and 85*c*. A selected detachable arm, e.g., detachable arm 85*a*, can be replaced by one of several other detachable arms, e.g., detachable arms 85*b* or 85*c* that are molded at specific angles. Each detachable arm 85*a*, 85*b*, 85*c* includes a thumb rest support 86 pivotally coupled to an arm portion by a pivot 87. As shown, three different detachable arms 85*a*, 85*b*, 85*c* are provided; however, any number of detachable arms can be provided to the user to change the position of the thumb rest support 86 to a desired position.

Figure 19A:
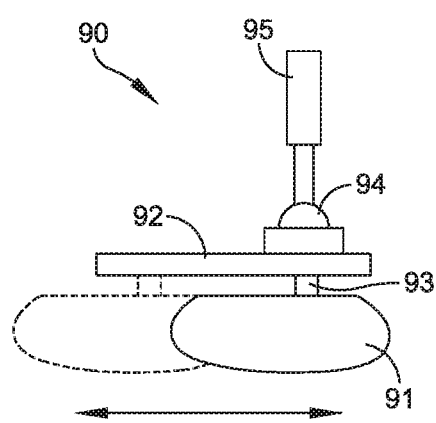
FIGS. 19A and 19B are schematic views of a thumb adjustment assembly of an adjustable mouse of another embodiment of the present disclosure.
Figure 19B:
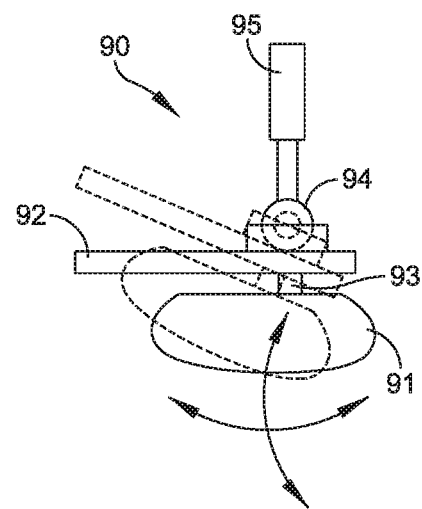

FIGS. 19A and 19B illustrate a thumb rest support assembly, generally indicated at 90, including a thumb rest support 91 that is mounted to a rail 92 by a shaft segment 93 for fine horizontal adjustment of the thumb rest support. The rail 92 also has an attached ball joint 94 that is mounted to a telescoping arm 95 to adjust an angle and an extension of the thumb rest support 91. The result is that the thumb rest support 91 can be moved horizontally, rotationally and in and out with respect to the base, and provided in a desired position by moving the thumb rest support along the rail 92, by extending and retracting the telescopic arm 95, and by pivoting the rail 92 with respect to the ball joint 94.

Figure 20:
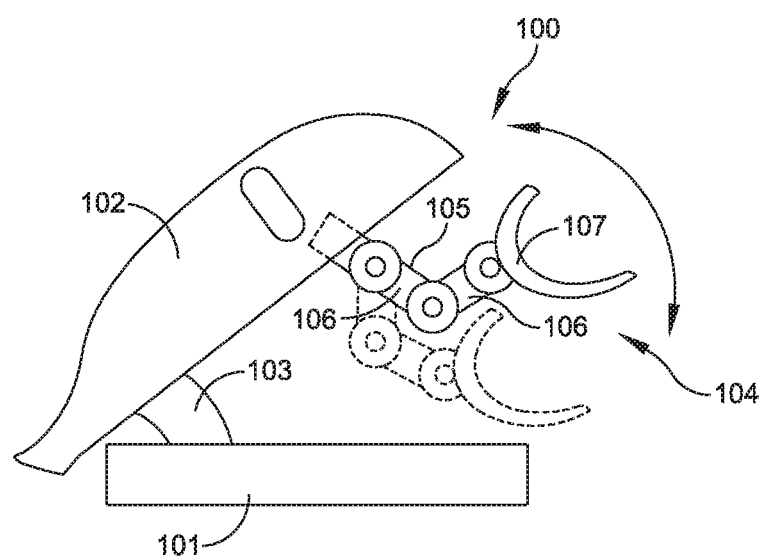
FIG. 20 is a schematic view of a thumb adjustment assembly of an adjustable mouse of another embodiment of the present disclosure.

FIG. 20 illustrates an adjustable mouse, generally indicated at 100. As shown, the adjustable mouse 100 includes a base 101, a body 102 hingedly mounted to the base by a hinge 103, and a thumb rest support assembly, generally indicated at 104, coupled to the body. The body 102 is capable of moving with respect to the base 101 to adjust the body to a desired position comfortable to the user. The thumb rest support assembly 104 includes an arm 105 that is comprised of two or more linked axle segments, each indicated at 106, for adjustment of a thumb rest support 107 position and extension. As shown, two axle segments 106 are provided; however, any number of axle segments may be provided to achieve a desired position of the thumb rest support 107 that is comfortable to the user.

The construction of the thumb adjustment assembly enables the thumb rest portion to be moved clockwise, counterclockwise, and tilt in multiple directions. The thumb adjustment assembly may be used to move the thumb rest portion toward or away from the adjustable mouse body thereby accommodating the particular characteristics of the user's hand. The embodiments disclosed herein are designed to allow a user's hand to expand by allowing the thumb to be moved farther away from the remainder of the hand. This relieves cramping and/or pain associated with mice that are too small for the users' hands. The thumb adjustment assembly enables the user to position the thumb rest portion at a desired position away from the base portion of the adjustable mouse.

As disclosed, embodiments of the adjustable mouse disclosed herein may be configured for use in a user's right or left hand. The adjustable mouse can be configured to control the motion of a pointer in two dimensions in a GUI, with the adjustable mouse converting the movements of the user's hand into equivalent electronic signals to move the pointer in the traditional manner. The adjustable mouse can include additional buttons, wheels and other devices that can be "clicked" or otherwise manipulated to perform certain actions by the user.

Other embodiments can include a microprocessor having sensors that are positioned inside the mouse that read the different adjustments and show them on a screen or saved to a personalized account. The microprocessor enables users to reposition the device to a preferred setting when the adjustable mouse is used by someone else. If saved to an account or in a general setting file, the microprocessor can also maintain DPI measurements, driver settings, and other information related to the use of the adjustable mouse. Other sensors can be provided inside the mouse to measure user activity, gauge light, and the like. Buttons positioned near a bottom of the mouse can be used to change commands of the buttons, such as disabling the right mouse click or altering a command of the right mouse button. A separate button can be added instead of using the same button as a DPI adjuster button.

Enumerated Embodiments

1. An adjustable mouse comprising:
a base portion including a flat bottom configured to rest on a flat surface and a curved top;
a palm rest portion including a body configured to be contoured to fit a user's hand and a curved bottom that is configured to mate with the curved top of the base portion; and
a mechanism configured to secure the palm rest portion to the base portion at a desired angle of tilt.

2. The adjustable mouse of claim 1, wherein the mechanism is configured to achieve a tilt angle between the palm rest portion and the base portion from a minimum angle shown of 21-degree to a maximum angle of 36-degree.

3. The adjustable mouse of any preceding claim, wherein the mechanism includes at least one slot formed in the curved bottom of the palm rest portion, at least one slide anchor, and at least one slide rail, with the at least one slide rail being positioned within the at least one slot.

4. The adjustable mouse of claim 3, wherein the mechanism further includes a threaded fastener that fastens the at least one slide anchor to the at least one slide rail to clamp the bottom of the palm rest portion between the at least one slide anchor and the at least one slide rail.

5. The adjustable mouse of any of claims 3 and 4, wherein the mechanism includes two slots, and two respective slide anchors and slide rails.

6. The adjustable mouse of any preceding claim, wherein body of the palm rest portion includes at least one finger button and/or a scroll wheel, which the user manipulates to operate the adjustable mouse.

7. The adjustable mouse of any preceding claim, further comprising a thumb adjustment assembly coupled to the base portion.

8. The adjustable mouse of claim 7, wherein the thumb adjustment assembly is configured to move a thumb rest portion between a retracted position and an extended position.

9. The adjustable mouse of any of claims 7 and 8, wherein the thumb adjustment assembly includes a shaft that extends from a body of the thumb rest portion, the shaft being coupled by the base portion to move the thumb rest portion toward and away from the palm rest portion and up and down with respect to the base portion.

10. The adjustable mouse of claim 9, wherein the shaft is frictionally received within a hub to extend and retract the thumb rest portion in a telescopic fashion.

11. The adjustable mouse of any of claims 9 and 10, wherein the shaft is coupled to the base portion by a pivot post that extends from the base portion and a bracket configured to rotate about the pivot post, the shaft being configured to pivot with respect to the base portion.

12. The adjustable mouse of claim 11, wherein the pivot post extends from the curved top of the base portion.

13. The adjustable mouse of any of claims 11 and 12, wherein the pivot post includes a cylindrical shaft and a cylindrical hub configured to frictionally receive the cylindrical shaft therein, the cylindrical shaft being secured at one end to the bracket with the other end being frictionally received within the cylindrical hub, the cylindrical hub being mounted on the curved top of the base portion.

14. The adjustable mouse of claim 13, wherein the cylindrical shaft is secured to the bracket to enable the cylindrical hub and the cylindrical shaft to rotate with respect to the pivot post.

15. The adjustable mouse of any of claims 9-14, wherein the shaft is secured to the thumb rest portion by a ball joint.

16. An adjustable mouse comprising:
a base portion;
a palm rest portion coupled to the base portion, the palm rest portion being configured to be secured to the base portion at a desired angle of tilt; and
a thumb adjustment assembly coupled to the base portion, the thumb adjustment assembly being configured to move a thumb rest portion between a retracted position and an extended position.

17. The adjustable mouse of claim 16, wherein the thumb adjustment assembly includes a shaft that extends from a body of the thumb rest portion, the shaft being coupled by the palm rest portion to move the thumb rest portion toward and away from the palm rest portion and up and down with respect to the base portion.

18. The adjustable mouse of claim 17, wherein the shaft is coupled to the base portion by a pivot post that extends from the base portion and a bracket configured to rotate about the pivot post, the shaft being configured to pivot with respect to the base portion.

19. The adjustable mouse of claim 18, wherein the pivot post extends from the curved top of the base portion.

20. The adjustable mouse of any of claims 18 and 19, wherein the pivot post includes a cylindrical shaft and a cylindrical hub configured to frictionally receive the cylindrical shaft therein, the cylindrical shaft being secured at one end to the bracket with the other end being frictionally received within the cylindrical hub, the cylindrical hub being mounted on the curved top of the base portion.

21. The adjustable mouse of claim 20, wherein the cylindrical shaft is secured to the bracket to enable the cylindrical hub and the cylindrical shaft to rotate with respect to the pivot post.

22. The adjustable mouse of any of claims 16-21, further comprising a mechanism configured to secure the palm rest portion to the base portion at a desired angle of tilt.

23. The adjustable mouse of claim 22, wherein the mechanism is configured to achieve a tilt angle between the palm rest portion and the base portion from a minimum angle shown of 21-degree to a maximum angle of 36-degree.

24. The adjustable mouse of any of claims 22 and 23, wherein the mechanism includes at least one slot formed in the curved bottom of the palm rest portion, at least one slide anchor, and at least one slide rail, with the at least one slide rail being positioned within the at least one slot.

25. The adjustable mouse of any of claims 22-24, wherein the mechanism further includes a threaded fastener that fastens the at least one slide anchor to the at least one slide rail to clamp the bottom of the palm rest portion between the at least one slide anchor and the at least one slide rail.

26. The adjustable mouse of any of claims 22-25, wherein the mechanism includes two slots, and two respective slide anchors and slide rails.

Other Embodiments are within the following claims.

Unless otherwise stated, use of the word "substantially" may be construed to include a precise relationship, condition, arrangement, orientation, and/or other characteristic, and deviations thereof as understood by one of ordinary skill in the art, to the extent that such deviations do not materially affect the disclosed methods and systems.

Throughout the entirety of the present disclosure, use of the articles "a" or "an" to modify a noun may be understood to be used for convenience and to include one, or more than one of the modified noun, unless otherwise specifically stated.

Elements, components, modules, and/or parts thereof that are described and/or otherwise portrayed through the figures to communicate with, be associated with, and/or be based on, something else, may be understood to so communicate, be associated with, and or be based on in a direct and/or indirect manner, unless otherwise stipulated herein.

Although the methods and systems have been described relative to a specific embodiment thereof, they are not so limited. Many modifications and variations may become apparent in light of the above teachings. Many additional changes in the details, materials, and arrangement of parts, herein described and illustrated, may be made by those skilled in the art.

Having described preferred embodiments of the invention it will now become apparent to those of ordinary skill in the art that other embodiments incorporating these concepts may be used. Accordingly, it is submitted that that the invention should not be limited to the described embodiments but rather should be limited only by the spirit and scope of the appended claims.

What is claimed is:

1. An adjustable mouse comprising:
   a base portion including a flat bottom configured to rest on a flat surface and a curved top;
   a palm rest portion including a body configured to be contoured to fit a user's hand and a curved bottom that is configured to mate with the curved top of the base portion;
   a mechanism configured to secure the palm rest portion to the base portion at a desired angle of tilt; and
   a thumb adjustment assembly, the thumb adjustment assembly being configured to move a thumb rest portion between a retracted position and an extended position, the thumb adjustment assembly including a shaft that extends from a body of the thumb rest portion, the shaft being coupled to a pivot post by a bracket configured to rotate about the pivot post, the shaft thereby being configured to pivot about the pivot post.

2. The adjustable mouse of claim 1, wherein the mechanism is configured to achieve a tilt angle between the palm rest portion and the base portion from a minimum angle shown of 21-degree to a maximum angle of 36-degree.

3. The adjustable mouse of claim 1, wherein the mechanism includes at least one slot formed in the curved bottom of the palm rest portion, at least one slide anchor, and at least one slide rail, with the at least one slide rail being positioned within the at least one slot.

4. The adjustable mouse of claim 1, wherein the mechanism further includes a threaded fastener that fastens the at least one slide anchor to the at least one slide rail to clamp the bottom of the palm rest portion between the at least one slide anchor and the at least one slide rail.

5. The adjustable mouse of claim 4, wherein the mechanism includes two slots, and two respective slide anchors and slide rails.

6. The adjustable mouse of claim 1, wherein body of the palm rest portion includes at least one finger button and/or a scroll wheel, which the user manipulates to operate the adjustable mouse.

7. The adjustable mouse of claim 1, wherein the thumb adjustment assembly is coupled to the palm rest portion.

8. The adjustable mouse of claim 1, wherein the shaft is frictionally received within a hub to extend and retract the thumb rest portion in a telescopic fashion.

9. The adjustable mouse of claim 1, wherein the pivot post extends from the curved top of the base portion.

10. The adjustable mouse of claim 9, wherein the pivot post includes a cylindrical shaft and a cylindrical hub configured to frictionally receive the cylindrical shaft therein, the cylindrical shaft being secured at one end to the bracket with the other end being frictionally received within the cylindrical hub, the cylindrical hub being mounted on the curved top of the base portion.

11. The adjustable mouse of claim 10, wherein the cylindrical shaft is secured to the bracket to enable the cylindrical hub and the cylindrical shaft to rotate with respect to the pivot post.

12. The adjustable mouse of claim 1, wherein the shaft is secured to the thumb rest portion by a ball joint.

13. An adjustable mouse comprising:
    a base portion;
    a palm rest portion coupled to the base portion, the palm rest portion being configured to be secured to the base portion at a desired angle of tilt; and
    a thumb adjustment assembly coupled to the base portion, the thumb adjustment assembly being configured to move a thumb rest portion between a retracted position and an extended position, the thumb adjustment assembly including a shaft that extends from a body of the thumb rest portion, the shaft being coupled to a pivot post by a bracket configured to rotate about the pivot post, the shaft thereby being configured to pivot about the pivot post.

14. The adjustable mouse of claim 13, wherein the thumb adjustment assembly is coupled to the palm rest portion.

15. The adjustable mouse of claim 13, wherein the pivot post extends from a curved top of the base portion.

16. The adjustable mouse of claim 15, wherein the pivot post includes a cylindrical shaft and a cylindrical hub configured to frictionally receive the cylindrical shaft therein, the cylindrical shaft being secured at one end to the bracket with the other end being frictionally received within the cylindrical hub, the cylindrical hub being mounted on the curved top of the base portion.

17. The adjustable mouse of claim 16, wherein the cylindrical shaft is secured to the bracket to enable the cylindrical hub and the cylindrical shaft to rotate with respect to the pivot post.

18. The adjustable mouse of claim 13, further comprising a mechanism configured to secure the palm rest portion to the base portion at a desired angle of tilt.

19. The adjustable mouse of claim 18, wherein the mechanism is configured to achieve a tilt angle between the palm rest portion and the base portion from a minimum angle shown of 21-degree to a maximum angle of 36-degree.

20. The adjustable mouse of claim 18, wherein the mechanism includes at least one slot formed in the curved bottom of the palm rest portion, at least one slide anchor, and at least one slide rail, with the at least one slide rail being positioned within the at least one slot.

21. The adjustable mouse of claim 20, wherein the mechanism further includes a threaded fastener that fastens the at least one slide anchor to the at least one slide rail to clamp the bottom of the palm rest portion between the at least one slide anchor and the at least one slide rail.

22. The adjustable mouse of claim 21, wherein the mechanism includes two slots, and two respective slide anchors and slide rails.

\* \* \* \* \*